(12) United States Patent
Sutardja

(10) Patent No.: US 8,400,774 B2
(45) Date of Patent: Mar. 19, 2013

(54) PACKAGING TECHNIQUES AND CONFIGURATIONS

(75) Inventor: Sehat Sutardja, Los Altos Hills, CA (US)

(73) Assignee: Marvell World Trade Ltd., St. Michael (BB)

( * ) Notice: Subject to any disclaimer, the term of this patent is extended or adjusted under 35 U.S.C. 154(b) by 311 days.

(21) Appl. No.: 12/772,852

(22) Filed: May 3, 2010

(65) Prior Publication Data

US 2010/0284158 A1    Nov. 11, 2010

Related U.S. Application Data

(66) Substitute for application No. 61/176,091, filed on May 6, 2009.

(51) Int. Cl.
*H05K 1/00* (2006.01)
*H05K 3/20* (2006.01)
*H01L 21/02* (2006.01)
*H01L 23/48* (2006.01)

(52) U.S. Cl. .......... 361/749; 174/254; 174/255; 29/831; 257/686; 257/E23.011; 257/E23.065; 257/E23.069; 257/E23.092

(58) Field of Classification Search .................. 438/614; 361/749
See application file for complete search history.

(56) References Cited

U.S. PATENT DOCUMENTS

| | | | |
|---|---|---|---|
| 5,953,589 A * | 9/1999 | Shim et al. ............ | 438/106 |
| 6,586,323 B1 * | 7/2003 | Fan et al. ............... | 438/614 |
| 2003/0054659 A1 | 3/2003 | Igarashi et al. | |
| 2006/0281223 A1 | 12/2006 | Liu et al. | |
| 2007/0026662 A1 | 2/2007 | Kawano et al. | |

FOREIGN PATENT DOCUMENTS

EP    0 797 253 A2    9/1997

* cited by examiner

*Primary Examiner* — Tuan T Dinh
*Assistant Examiner* — Mukund G Patel

(57) ABSTRACT

One embodiment of the present disclosure provides an apparatus comprising a flex circuit substrate having a core, a first solder mask and first traces disposed on the core on a first side of the flex circuit substrate, and a second solder mask and second traces disposed on the core on a second side of the flex circuit substrate. The first side is opposite to the second side. The apparatus further includes vias formed through the core to electrically couple the first traces to the second traces, and a stiffening structure coupled to the first side of the flex circuit substrate to increase structural rigidity of the flex circuit substrate. The stiffening structure provides structural, support to allow attachment of an integrated circuit die to the first side of the flex circuit substrate.

20 Claims, 8 Drawing Sheets

PACKAGING TECHNIQUES AND CONFIGURATIONS

CROSS REFERENCE TO RELATED APPLICATIONS

The present application claims priority to U.S. Provisional Patent Application No. 61/176,091, filed May 6, 2009, the entire specification of which is hereby incorporated by reference in its entirety for all purposes, except for those sections, if any, that are inconsistent with this specification.

TECHNICAL FIELD

Embodiments of the present disclosure relate to the field of integrated circuits, and more particularly, to packaging configurations for flex circuits, and associated fabrication processes.

BACKGROUND

Flex technology involves assembly of electronic circuits referred to as "flexible circuits" or "flex circuits" by mounting electronic devices such as semiconductor chips onto flexible substrates. Generally, the flexible substrates are very thin (e.g., thickness of about 30 microns to about 200 microns) and difficult to handle due to their flexible nature. Thus, equipment and operations associated with packaging and assembly of flex circuits can easily distort the flexible substrates during processing. The distortion of flexible substrates can result in lower product yields and/or product reliability. The description in this section is related art, and does not necessarily include information disclosed under 37 C.F.R. 1.97 and 37 C.F.R. 1.98. Unless specifically denoted as prior art, it is not admitted that any description of related art is prior art.

SUMMARY

In one embodiment, an apparatus comprises a flex circuit substrate having a core, a first solder mask and first traces disposed on the core on a first side of the flex circuit substrate, and a second solder mask and second traces disposed on the core on a second side of the flex circuit substrate. The first side is opposite to the second side. The apparatus further includes vias formed through the core to electrically couple the first traces to the second traces, and a stiffening structure coupled to the first side of the flex circuit substrate to increase structural rigidity of the flex circuit substrate. The stiffening structure provides structural support to allow attachment of an integrated circuit die to the first side of the flex circuit substrate.

In one aspect, a method is disclosed to provide a flex circuit substrate. The method includes providing a flex circuit substrate comprising a core, a first solder mask and first traces disposed on the core on a first side of the flex circuit substrate, a blanket metal layer disposed on the core on a second side of the flex circuit substrate to increase structural rigidity of the flex circuit substrate. The second side is opposite to the first side. Vias are formed through the core to electrically couple the first traces and the blanket metal layer. The method further includes attaching an integrated circuit die to the first side of the flex circuit substrate, depositing a mold compound to substantially cover the integrated circuit die and the first side of the flex circuit substrate, and selectively removing portions of the blanket metal layer to form second traces on the second side of the flex circuit substrate.

In another aspect, the method further includes depositing a photoresist or hardmask material on the blanket metal layer, and exposing the photoresist or hardmask material to light energy in order to define a pattern for the second traces. The photoresist or hardmask material is deposited on the blanket metal layer prior to attaching the integrated circuit die to the first side, and the pattern is etched to form the second traces after attaching the integrated circuit die to the first side. Attaching the integrated circuit die to the first side of the flex circuit substrate comprises electrically coupling the integrated circuit die to the first traces in at least one of a wire bonding, flip-chip, and multi-chip module arrangement.

In a further aspect, the method includes depositing a solder mask material to cover the second traces, and selectively removing portions of the solder mask material to form a second solder mask that allows electrical connection to at least one of the second traces. The method further includes attaching solder balls to the second side of the flex circuit substrate to form an electrical connection between the solder balls and the second traces.

In yet another aspect, the method includes attaching a passive component to the first side of the flex circuit substrate prior to attaching the integrated circuit die to the first side of the flex circuit substrate, and forming a stiffening structure on the first side to increase structural rigidity of the flex circuit substrate.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Embodiments herein are illustrated by way of example and not by way of limitation in the figures of the accompanying drawings.

DETAILED DESCRIPTION

Embodiments of the present disclosure describe packaging techniques and configurations for flex circuits. In the following detailed description, reference is made to the accompanying drawings which form a part hereof, wherein like numerals designate like parts throughout. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

The description may use perspective-based descriptions such as up/down, back/front, over/under, above/beneath, underlying, and top/bottom. Such descriptions are merely used to facilitate the discussion and are not intended to restrict the application of embodiments described herein to any particular orientation.

For the purposes of the present disclosure, the phrase "A/B" means A or B. For the purposes of the present disclosure, the phrase "A and/or B" means "(A), (B), or (A and B)." For the purposes of the present disclosure, the phrase "at least one of A, B, and C" means "(A), (B), (C), (A and B), (A and C), (B and C), or (A, B and C)." For the purposes of the present disclosure, the phrase "(A)B" means "(B) or (AB)" that is, A is an optional element.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The description uses the phrases "in an embodiment," "in embodiments," or similar language, which may each refer to one or more of the same or different embodiments. Furthermore, the terms "comprising," "including," "having," and the like, as used with respect to embodiments of the present disclosure, are synonymous.

Figure 1:
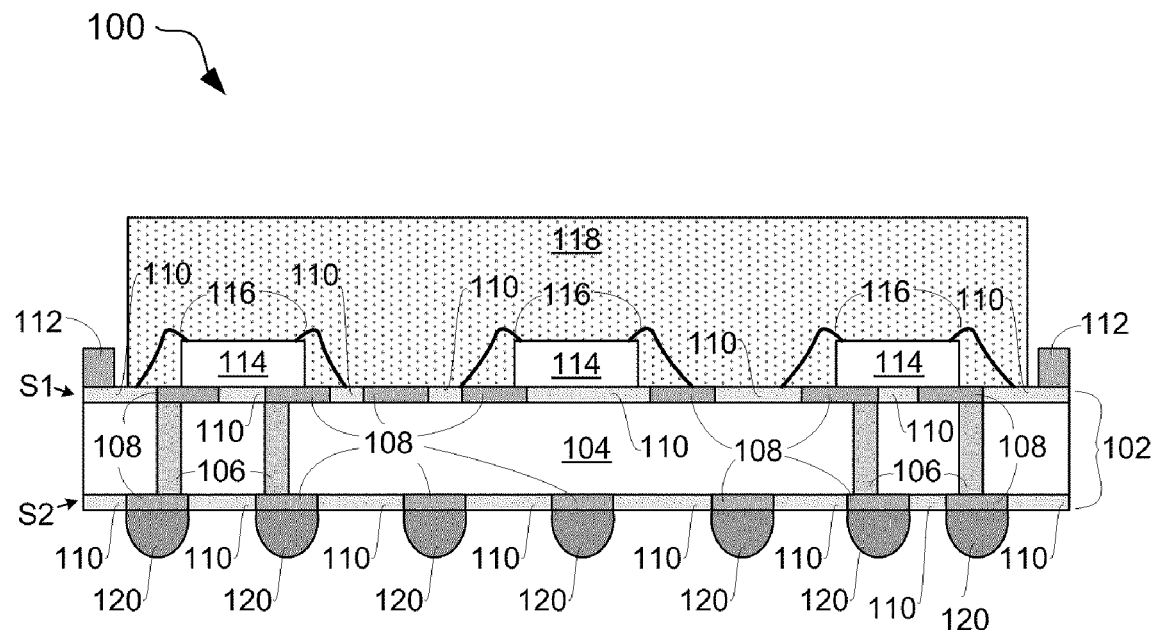
FIG. 1 schematically illustrates an elevation cross-section view of a flex circuit package, in accordance with various embodiments.

FIG. 1 schematically illustrates an elevation cross-section view of a flex circuit package 100, in accordance with various embodiments. The flex circuit package 100 includes a flex circuit substrate 102 having a core 104 with vias 106 formed through the core 104 to electrically couple traces 108 disposed on a first side S1 of the flex circuit substrate 102 with traces 108 disposed on a second side S2 of the flex circuit substrate 102. The traces 108 are used to route electrical signals associated with the flex circuit package 100. The traces 108 can include high density wiring for fan-out of one or more IC dies 114 coupled to the traces 108. The traces 108 can further include fine traces for ground shielding. The vias 106 can be formed by laser, drilling, etching, or any other suitable process.

The core 104 includes an electrically insulative material such as, for example, polyimide or poly-ether-ether-ketone (PEEK) and the vias 106 and traces 108 include an electrically conductive material such as metal (e.g., copper or aluminum). Other suitable materials can be used for the core 104, vias 106, and traces 108 in other embodiments. In an embodiment, the flex circuit substrate 102 comprises a two-layer polyimide tape having copper traces 108.

A solder mask 110, also referred to as "overlay," is disposed on the core 104 to provide a protective coating for the traces 108. The solder mask 110 includes an electrically insulative material such as, for example, epoxy. In an embodiment, the material for the solder mask 110 is photo-definable to allow selective removal of the solder mask material to provide openings in the solder mask 110. The solder mask 110 includes openings to allow electrical connections to be made, for example, between wire bonds 116 or solder balls 120 and the traces 108. For illustrative purposes, the solder mask 110 is shown to be level or even with the traces 108; however, it should be understood that the solder mask 110 may be deposited in such a way that the solder mask 110 may completely cover some of the traces 108, while portions of the solder mask 110 may extend above and overlap some of the traces 108.

As used herein, the first side S1 and the second side S2 generally refer to opposing sides of the flex circuit substrate 102 to provide clarity of discussion in connection with various elements. The first side S1 is opposite to the second side S2, as illustrated.

A stiffening structure 112 is coupled to the first side S1 of the flex circuit substrate 102 to increase structural rigidity of the flex circuit substrate 102 during packaging operations associated with attaching one or more integrated circuit (IC) dies 114 to the flex circuit substrate 102. The stiffening structure 112 is made of any suitable material to increase structural rigidity of the flex circuit substrate 102, including, for example, metals and polymers. In an embodiment, the stiffening structure 112 includes at least one of copper and steel. The stiffening structure 112 can further include a flame retardant 4 (FR-4) material, where FR-4 meets the requirements of Underwriters Laboratories UL94-V0. Other suitable materials can be used to form the stiffening structure 112 in other embodiments. It should be noted that the stiffening structure 112 is located outside of mold compound 118.

In an embodiment, the stiffening structure 112 is fabricated and subsequently attached to the first side S1 of the flex circuit substrate 102. In another embodiment, the stiffening structure 112 is formed on the first side S1 using a metal that is deposited to form the traces 108 on the first side S1. Techniques associated with such embodiments are further described in connection with FIGS. 4 and 6.

Figure 2:
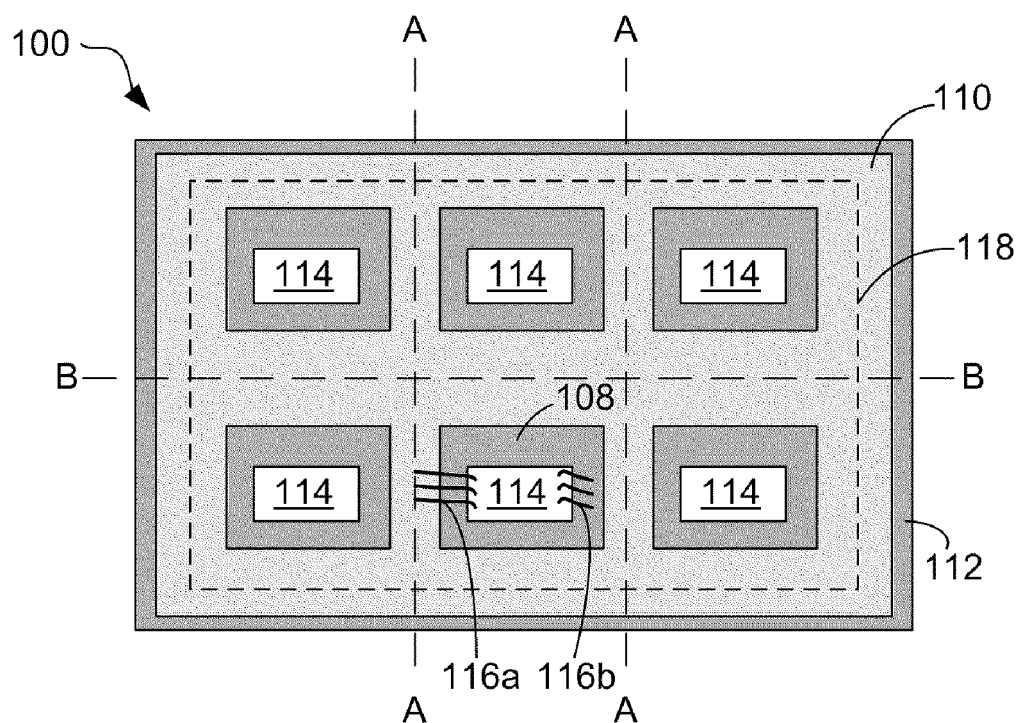
FIG. 2 schematically illustrates a plan view of a flex circuit package, in accordance with various embodiments.

Turning briefly to FIG. 2, a plan view of the flex circuit package 100 is schematically illustrated. The boundary of the mold compound 118 is delineated by the dotted line. As shown in FIG. 2, the flex circuit package 100 is surrounded by the stiffening structure 112. The area or space between the mold compound 118 and the stiffening structure 112 may vary. It should be noted that FIG. 2 shows six (6) IC dies 114 situated on the flex circuit substrate 102; however, the number of IC dies 114 may vary depending on a particular design or processing constraints. The stiffening structure 112 allows attachment of one or more dies 114 to the first side S1 of the flex circuit substrate 102. Each of the IC dies 114 may include a number of wire bonds 116a and 116b that provide coupling to other connections.

The stiffening structure 112 can be physically coupled to the first side S1 in a variety of ways using any suitable technique that increases structural rigidity of the flex circuit substrate 102 to facilitate handling during packaging and/or assembly. For example, as shown in FIG. 2, the stiffening structure 112 may be located substantially around the perimeter of the flex circuit package 100. However, it should be understood that in other embodiments, the stiffening structure 112 may be broken up into different disjointed portions, each portion extending substantially along an edge of the flex circuit package 100. By increasing structural integrity of the flex circuit substrate 102, the stiffening structure 112 reduces distortion of the flex circuit substrate 102 caused by equipment or operations associated with packaging/assembly of the flex circuit package 100. For example, the stiffening structure 112 may provide stability and structural integrity when the flex circuit package 100 is cut into individual packages along lines A and B.

Returning to FIG. 1, one or more IC dies 114 are attached to the first side S1 of the flex circuit substrate 102. The IC dies 114 can be attached according to a variety of techniques including surface-mount technology (SMT). Although the illustrated example depicts the IC dies 114 coupled to the flex circuit substrate 102 using wire bonds 116, subject matter of the present disclosure is not limited in this regard. In other embodiments, the IC dies 114 can be coupled to the flex circuit substrate 102 using other configurations such as, for example, a flip-chip configuration. The flip-chip configuration generally implements solder bumps (not shown) to connect the IC dies 114 to corresponding lands (not shown) on the first side S1, the lands being electrically coupled to the traces 108 of the first side S1. The IC dies 114 can be implemented in a multi-chip-module (MCM) arrangement with one or more passive components. Other configurations can be implemented for the flex circuit package 100 in other embodiments.

The IC dies 114 generally include integrated circuit devices such as, for example, transistors or memory cells formed on a semiconductor substrate. The IC dies 114 can include, for example, a processor or memory.

The mold compound 118 is deposited to encapsulate the IC dies 114. The mold compound 118 protects the IC dies 114 from defects associated with moisture and oxidation and provides a stronger, more robust flex circuit package 100 by encapsulating and holding the IC dies 118 to the flex circuit substrate 102. The mold compound 118 generally includes polymers such as epoxy resins, but materials for the mold compound are not limited in this regard. Other suitable electrically insulative materials can be used to form a mold compound 118 in other embodiments.

Solder balls 120 are electrically coupled to traces 108 on the second side S2 of the flex circuit substrate 102. The solder balls 120 are generally attached to lands (not shown) coupled to the traces 108 on the second side S2. Other electrical devices such as a motherboard or other type of circuit board can be electrically coupled to the IC dies 114 through the flex circuit substrate 302 using the solder balls 120.

In an embodiment, one or more passive components (not shown) are attached to the first side S1 of the flex circuit substrate 102. A more rigid flex circuit substrate 102 as provided by the stiffening structure 112 or other technique disclosed herein allows the attachment of passive components to the flex circuit substrate 102. The passive components include, for example, resistors, capacitors, inductors and diodes. Other passive components can be attached in other embodiments. In the following description, multiple techniques for providing a more rigid flex circuit substrate 102 during packaging/assembly operations are disclosed.

Figure 3:
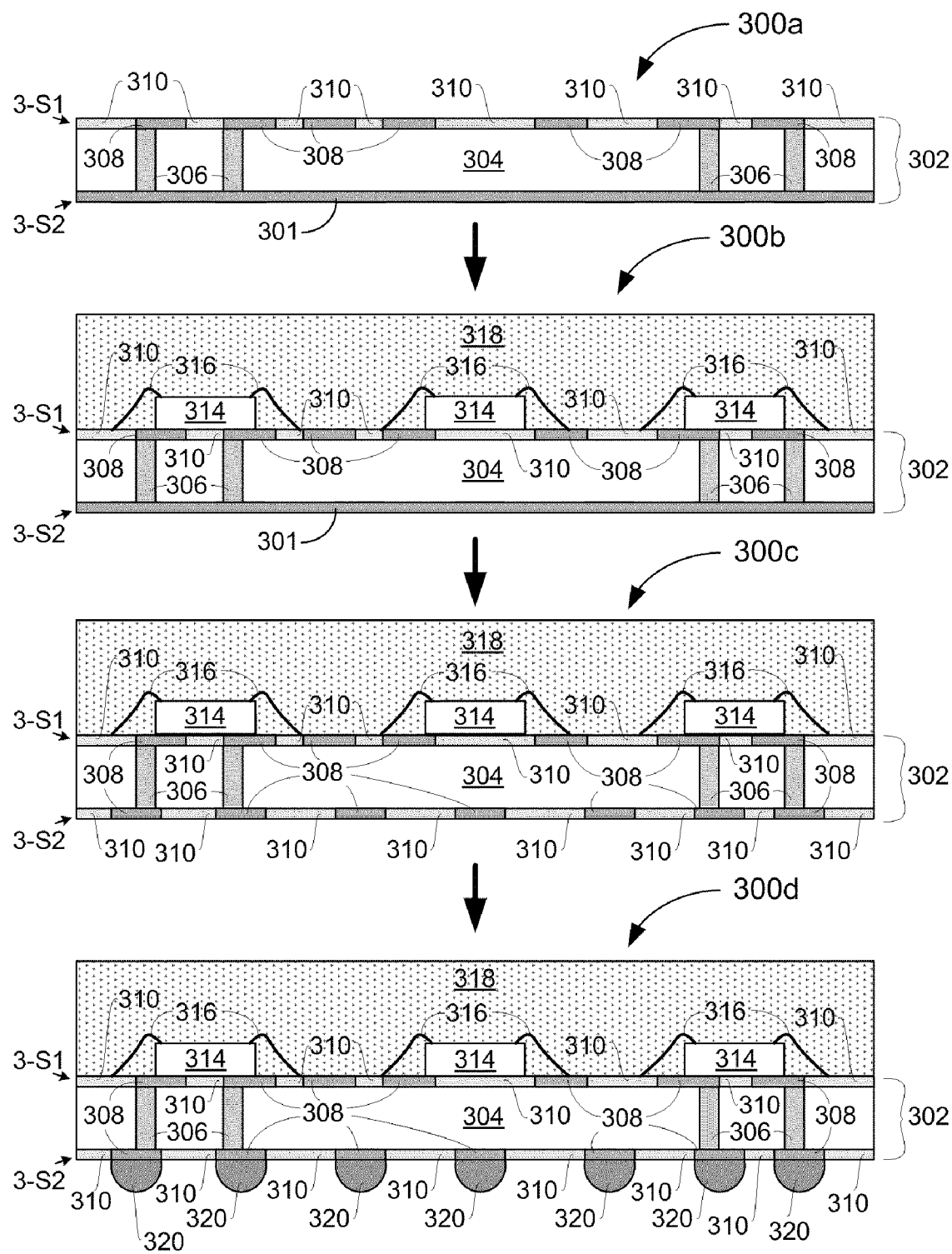
FIG. 3 schematically illustrates an elevation cross-section view of a flex circuit after various packaging operations, in accordance with various embodiments.

FIG. 3 schematically illustrates an elevation cross-section view of a flex circuit (e.g., 300a-d) after various packaging operations, in accordance with various embodiments. In flex circuit 300a, a flex circuit substrate 302 is provided having a core 304 with vias 306 formed therein to electrically couple traces 308 formed on a first side 3-S1 of the flex circuit substrate 302 with a blanket metal layer 301 formed on a second side 3-S2 of the flex circuit substrate 302. Solder mask 310 is further disposed on the first side 3-S1. The blanket metal layer 301 on the second side 3-S2 is a blanket in the sense that it is not intentionally interrupted with voids or holes. In one embodiment, the blanket metal layer 301 is coupled to substantially cover the entire second side 3-S2 of the flex circuit substrate 302.

The blanket metal layer 301 includes a material that is used to form traces 308 on the second side 3-S2 of the flex circuit substrate 302. In one embodiment, the blanket metal layer 301 comprises copper. The subject matter of the present disclosure is not limited in this regard and the blanket metal layer 301 can include any suitable material to increase structural rigidity of the flex circuit substrate 302.

The blanket metal layer 301 provides structural rigidity to the flex circuit substrate 302 during process operations associated with forming the traces 308 and solder mask 310 on the first side 3-S1. The process operations can include, for example, deposition of materials, lithography, etch, plating, cleaning, and metrology operations. Other operations may be used to form the traces 308 and solder masks 310.

Referring to flex circuit 300b, the blanket metal layer 301 further provides structural rigidity to the flex circuit substrate 302 during process operations associated with attachment of IC dies 314 to the first side 3-S1 (referred to herein as die attachment), attachment of wire bonds 316 to couple the IC dies 314 (referred to herein as wire bonding), and/or encapsulating the IC dies 314 with mold compound 318 (referred to herein as molding). Operations associated with die attachment, wire bonding, and/or molding can be particularly harsh and distort a flex circuit substrate that does not have structural rigidity as provided by the blanket metal layer 301. Additional operations can be performed that benefit from structural stiffening of the flex circuit substrate 302 such as plating operations. Plating operations are generally associated with coupling the IC dies 314 or other elements to the traces 308. The plating operations can, for example, be used to selectively deposit gold or another suitable material to selected lands or traces 308 disposed on the first side 3-S1 or second side 3-S2 of the flex circuit substrate 302.

Portions of the blanket metal layer 301 of flex circuit 300b are selectively removed to form traces 308 on the second side 3-S2 of the flex circuit substrate 302 in flex circuit 300c. A variety of techniques can be used to form the traces 308 on the second side 3-S2 using the blanket metal layer 301.

In one embodiment, photoresist material is deposited to the blanket metal layer 301 prior to attaching the IC dies 314. The photoresist material is defined with a pattern for the traces 308 on the second side 3-S2 by exposing the photoresist to light energy through a mask having the desired layout of traces 308. The patterned photoresist is developed to allow an etching process to selectively remove portions of the blanket metal layer 301 to form the traces 308 on the second side 3-S2. The exposing and developing operations can be performed before or after attaching the IC dies 314, according to various embodiments, because the structural integrity of the blanket metal layer 301 is not significantly affected by such operations. In an embodiment, etching the blanket metal layer 301 is performed subsequent to the die attach, wire bonding, and/or molding operations described previously. Etching after the mold compound 318 is deposited is beneficial because the mold compound 318 provides additional strength and support to the flex circuit 300c during the etch process. Also, the mold compound 318 lends structural support to the flex circuit substrate 302 for additional packaging operations after the blanket metal layer 301 is etched to form traces 308. In other embodiments, the depositing, exposing, and developing of photoresist on the blanket metal layer 301 occur after the die attach, wire bonding, and/or molding operations described previously.

The traces 308 on the second side 3-S2 can be formed using a hard mask technique. In the hard mask technique, a material other than photoresist is deposited to the blanket metal layer 301 and patterned to provide an etch mask such that an etching process selectively removes portions of the blanket metal layer 301 to form the traces 308 on the second side 3-S2. In another embodiment, a material such as gold or other etch-selective material is selectively deposited (e.g., by plating) or deposited and patterned to provide a hard mask. An etching process is applied to the patterned hard mask to form the traces 308 on the second side 3-S2. The traces 308 on the second side 3-S2 are formed, for example, by etching away material of the blanket metal layer 301 that is not covered by the hard mask. Similar principles and timing apply to the hard mask technique with respect to the die attach, wire bonding, and molding operations as described previously in connection with the photoresist technique. For example, the blanket metal layer 301 can be plated with gold (e.g. hard mask) at locations where traces 308 are desired on the second side 3-S2 at or prior to an operation associated with flex circuit 300a to take advantage of large panel processing associated with production of flex circuit substrate 302.

A solder mask 310 is formed to protect the traces 308 on the second side 3-S2. Portions of the solder mask 310 are selectively removed to allow connection of a circuit board, such as a motherboard, to the second side 3-S2 of the flex circuit substrate.

In flex circuit 300d, solder balls 320 are attached to the second side 3-S2 of the flex circuit substrate 302 to provide a ball-grid array (BGA) type package. The solder balls 320 are generally connected to lands that are electrically coupled to the traces 308. The lands can be plated with a material such as gold. In a land-grid array (LGA) type package implementation (not shown), the solder balls 320 are not attached. Additional operations can be performed on the flex circuit 300d such as singulation.

Figure 4:
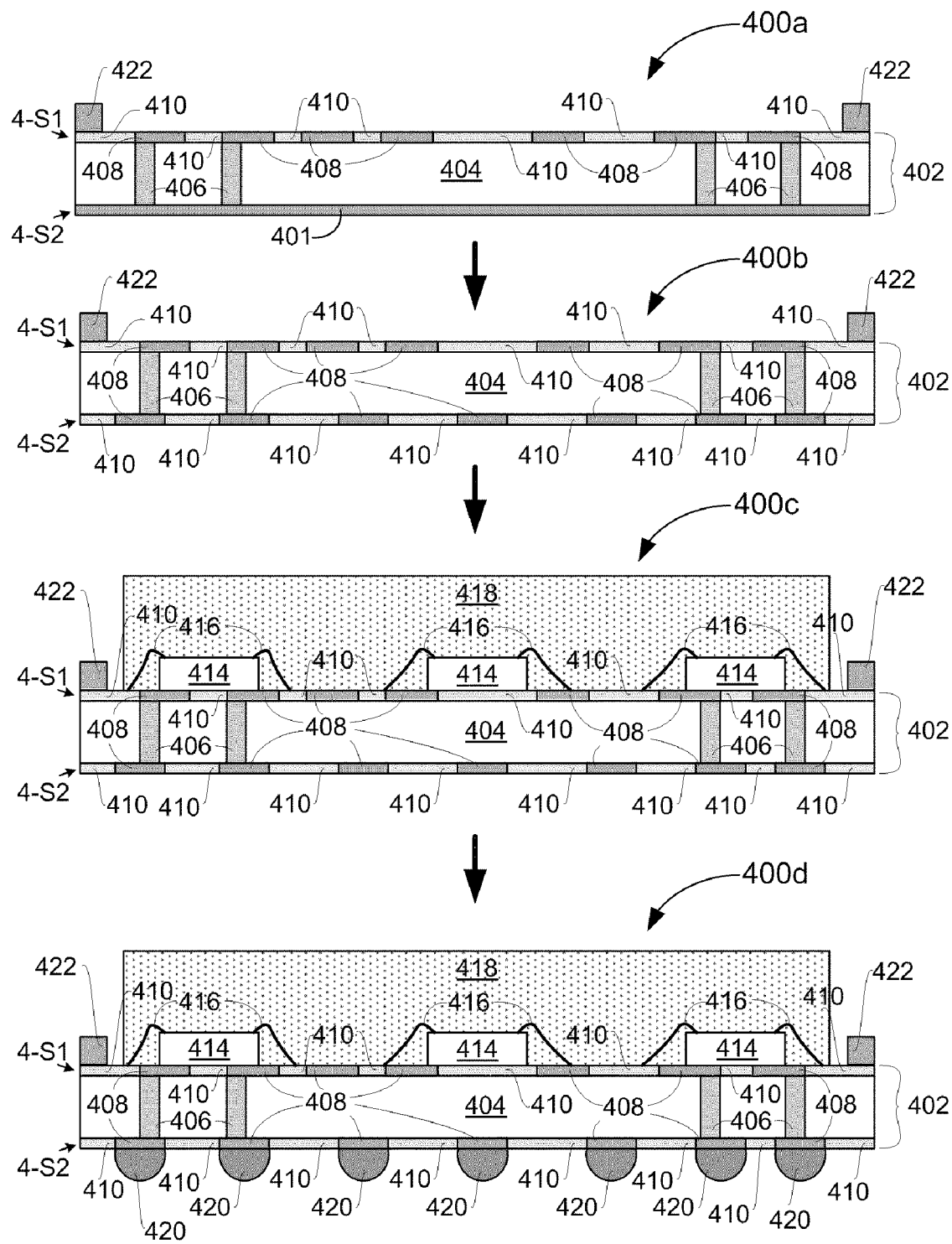
FIG. 4 schematically illustrates an elevation cross-section view of another flex circuit after various packaging operations, in accordance with various embodiments.

FIG. 4 schematically illustrates an elevation cross-section view of another flex circuit (e.g., 400a-d) after various packaging operations, in accordance with various embodiments. In flex circuit 400a, a flex circuit substrate 402 is provided having a core 404 with vias 406 formed therein to electrically couple traces 408 formed on a first side 4-S1 of the flex circuit substrate 402 with a blanket metal layer 401 formed on a second side 4-S2 of the flex circuit substrate 402. Solder mask 410 is further disposed on the first side 4-S1. In one embodiment, the blanket metal layer 401 is coupled to substantially cover the entire second side 4-S2 of the flex circuit substrate 402.

The blanket metal layer 401 provides structural rigidity to the flex circuit substrate 402 during process operations associated with forming the traces 408 and solder mask 410 on the first side 4-S1. The process operations can include, for example, deposition of materials, lithography, etch, plating, cleaning, and metrology operations. Other operations can be used to form the traces 408 and solder masks 410. The blanket metal layer 401 further provides structural rigidity to the flex circuit substrate 402 during formation of the stiffening structure 422 on the first side 4-S1. For example, the blanket metal layer 401 provides structural rigidity to allow patterning operations or attachment operations that form the stiffening structure 422 on the first side 4-S1.

The blanket metal layer 401 includes a material that is used to form traces 408 on the second side 4-S2 of the flex circuit substrate 402. In one embodiment, the blanket metal layer 401 comprises copper. The subject matter of the present disclosure is not limited in this regard and the blanket metal 401 layer can include any suitable material to increase structural rigidity of the flex circuit substrate 402.

The stiffening structure 422 is formed on the first side 4-S1 of the flex circuit substrate 402, as illustrated. The stiffening structure 422 comports with embodiments already described in connection with FIGS. 1-2.

In flex circuit 400b, traces 408 and solder mask 410 are formed on the second side 4-S2 of the flex circuit substrate 402. The stiffening structure 422 provides structural rigidity to the flex circuit substrate 402 to allow selective removal of portions of the blanket metal layer 401 to form the traces 408 on the second side 4-S2. Solder mask 410 is formed on the second side 4-S2 by depositing solder mask material to protect the traces 408 and patterning the deposited solder mask material to expose areas for electrical connection to the second side 4-S2. The electrical connection to the second side 4-S2 can be made, for example, using BGA or LGA-type packaging configurations. Plating operations can be implemented according to embodiments described in connection with FIG. 3.

In flex circuit 400c, the stiffening structure 422 provides structural rigidity to the flex circuit substrate 402 during operations associated with attaching IC dies 414 to the first surface 4-S1, attaching wire bonds 416 (if used), and applying mold compound 418 to encapsulate the IC dies 414. Such operations comport with embodiments already described in connection with FIG. 3.

In flex circuit 400d, solder balls 420 are attached to the second side 4-S2 to provide an electrical connection between the flex circuit substrate 402 and another circuit board such as, for example, a motherboard. In other embodiments (e.g., LGA-type packaging), solder balls 420 are not needed for electrical connections.

Figure 5:
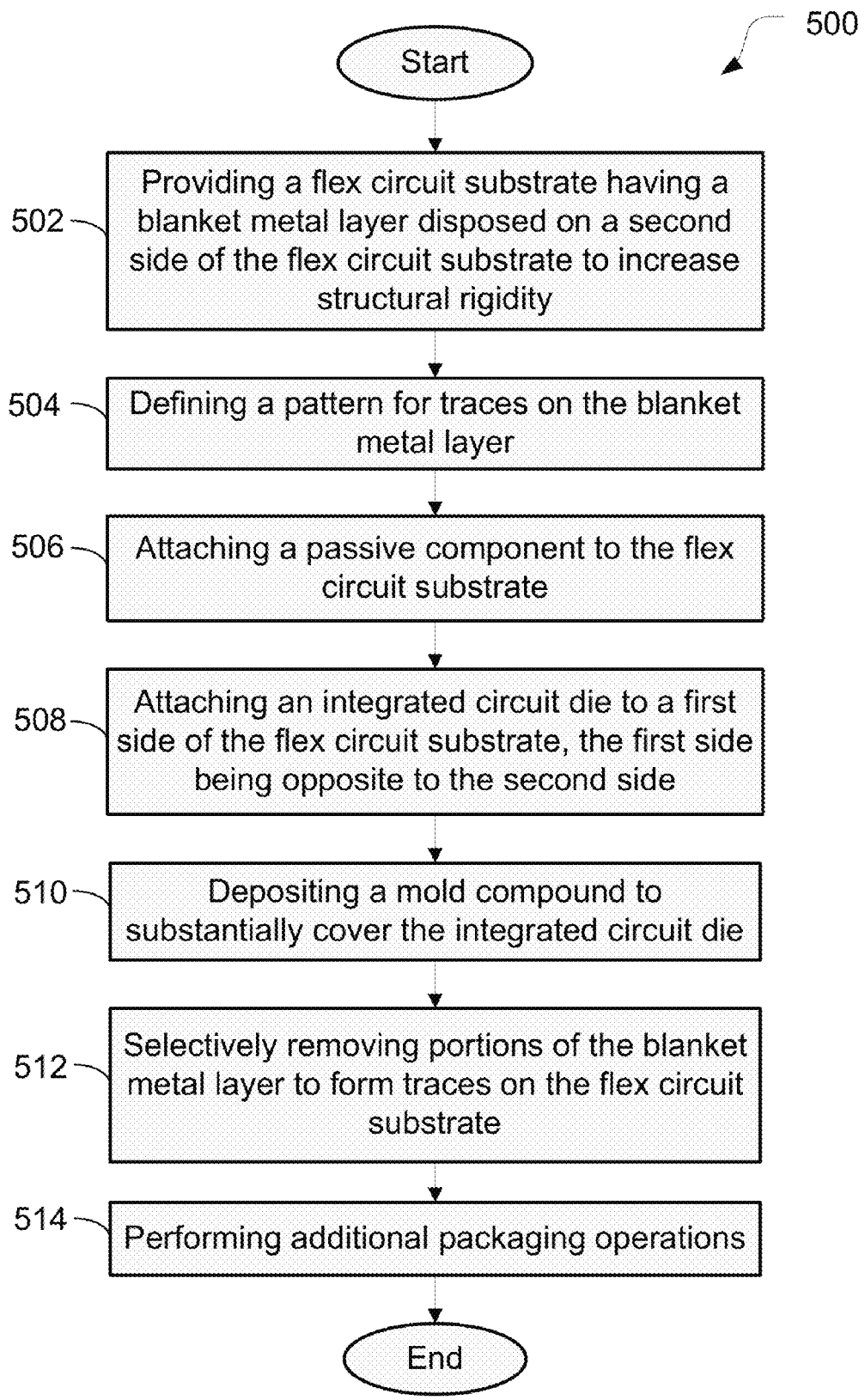
FIG. 5 is a process flow diagram of a method to fabricate a flex circuit, in accordance with various embodiments.

FIG. 5 is a process flow diagram of a method 500 to fabricate a flex circuit, in accordance with various embodiments. Method 500 describes operations and actions associated with fabricating a flex circuit (e.g., 300a-d) as described in connection with FIG. 3.

At block 502, a flex circuit substrate is provided having a blanket metal layer disposed on a second side (e.g., 3-S2 of FIG. 3) of the flex circuit substrate to increase structural rigidity. In an embodiment, the flex circuit substrate includes a core made of an electrically insulative material, a first solder mask and first traces disposed on the core on a first side (e.g., 3-S1 of FIG. 3) of the flex circuit substrate and a blanket metal layer disposed on the core on a second side of the flex circuit substrate. Vias are formed in the core to electrically couple the traces on the first side with the blanket metal layer on the second side. Vias can be formed, for example, by laser, drilling, or etching.

At block 504, a pattern for traces is defined on the blanket metal layer. Patterning the traces on the blanket metal layer can be performed in a variety of ways. In one embodiment, a photoresist material is deposited to the blanket metal layer and exposed to light energy that defines a pattern for the traces on the second side. The exposed photoresist material is developed to remove portions of the photoresist such that an etching process can form the traces on the second side using the photoresist pattern as an etch mask.

In another embodiment, a hardmask material is deposited and patterned or selectively deposited (e.g., by plating) to define a pattern for traces on the blanket metal layer. As described further with respect to FIG. 3, the timing of operations to define a pattern for the traces on the second side can vary. In one embodiment, the photoresist or hardmask material is deposited to the blanket metal layer prior to attaching an IC die to the first surface. For example, the blanket metal layer can be plated with gold (e.g. hard mask) at locations where traces are desired on the second side during fabrication of the flex circuit substrate, prior to die attachment, to take advantage of large panel processing associated with production of the flex circuit substrate. In other embodiments, the photoresist or hardmask material is deposited to the blanket metal layer after attaching the IC die to the first surface.

At block 506, one or more passive components are attached to the flex circuit substrate. The passive components can be attached using any suitable technique including surface-mount technology. The blanket metal layer provides structural rigidity that allows attachment of the passive component prior to a molding operation that further provides structural rigidity to the flex circuit substrate. In an embodiment, the passive component is attached prior to attaching the IC die. The passive component can be part of a MCM configuration. The passive component can include, for example, resistors, capacitors, inductors and diodes. Other passive components can be attached in other embodiments.

At block 508, the IC die is attached to the first side of the flex circuit substrate. The IC die can be attached using a variety of configurations including, for example, wire bonding, flip-chip, and/or MCM configurations. The IC die is electrically coupled to traces on the first side. At block 510, a mold compound is deposited to substantially cover or encapsulate the integrated circuit die.

At block 512, portions of the blanket metal layer are selectively removed to form traces on the second side of the flex circuit substrate. In an embodiment, an etch process is used to selectively remove portions of the blanket metal layer underlying an etch mask of patterned photoresist or a hard mask material after attaching the IC die to the first side of the flex circuit substrate. In another embodiment, portions of the blanket metal layer are selectively removed after a mold compound is deposited. The mold compound provides additional structural support to the flex circuit substrate during the etch process.

At block 514, additional packaging operations can be performed to prepare the flex circuit for use as a product. For example, in some embodiments, a solder mask material is deposited to cover the traces on the second side. Portions of the solder mask material are selectively removed to form a solder mask on the second side that allows electrical connection to the traces on the second side. In some embodiments, solder balls are attached to the second side of the flex circuit substrate. Plating operations to prepare areas on the first side and/or second side of the flex circuit substrate for electrical connections can be performed. Singulation can be performed to provide discrete flex circuit products. Other additional operations can be performed.

Figure 6:
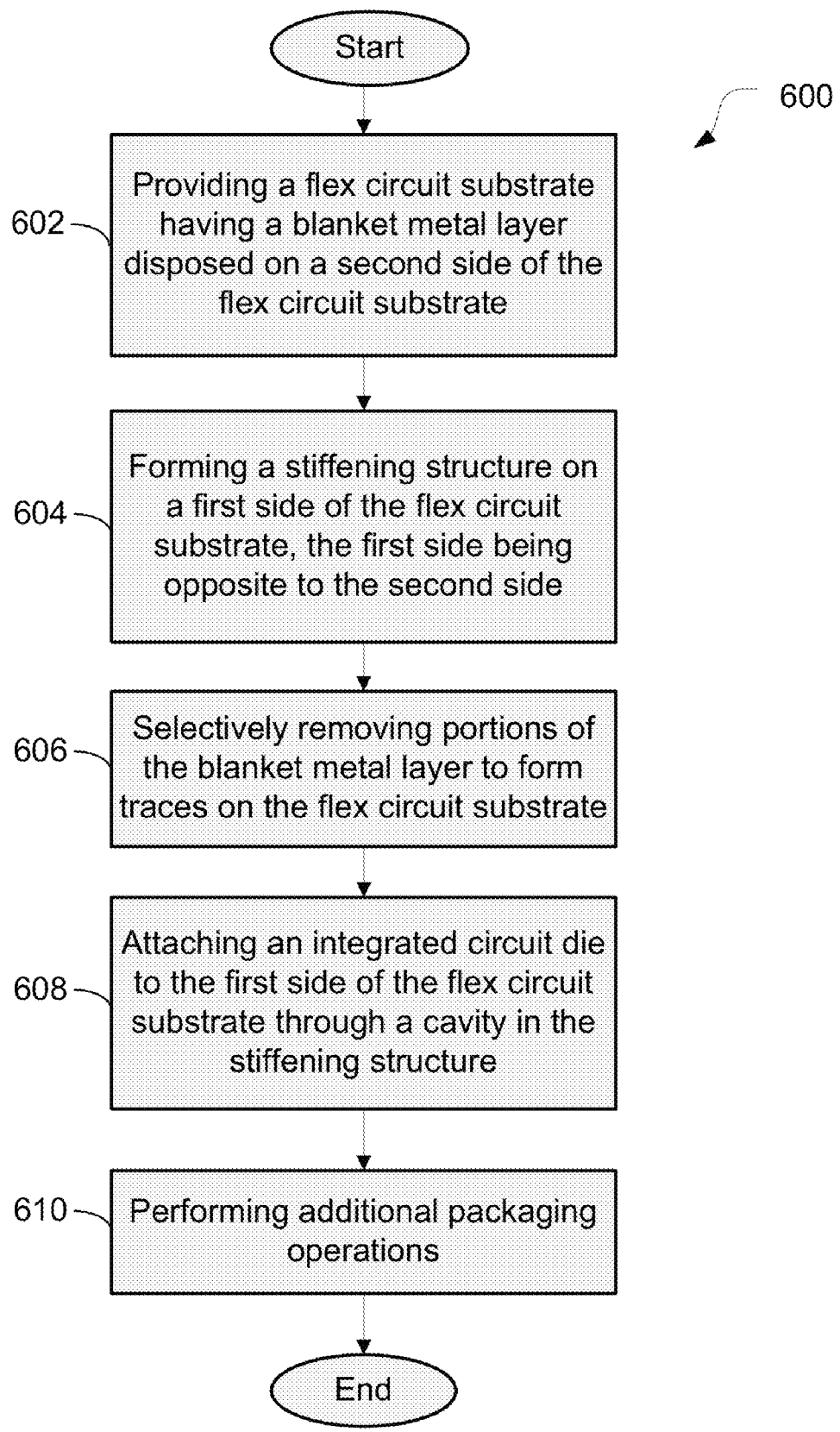
FIG. 6 is a process flow diagram of another method to fabricate a flex circuit, in accordance with various embodiments.

FIG. 6 is a process flow diagram of another method 600 to fabricate a flex circuit, in accordance with various embodiments. Method 600 describes operations and actions associated with fabricating a flex circuit (e.g., 400a-d) as described in connection with FIG. 4.

At block 602, a flex circuit substrate is provided having a blanket metal layer disposed on a second side (e.g., 4-S2 of FIG. 4) of the flex circuit substrate. The flex circuit substrate is provided having similar features as described in connection with block 502 of method 500.

At block 604, a stiffening structure is formed on a first side (e.g., 4-S1 of FIG. 4) of the flex circuit substrate. The blanket metal layer on the second side provides structural support to the flex circuit substrate during formation of the stiffening structure. In an embodiment, the stiffening structure is formed using the same material deposited to form the traces on the first side of the flex circuit substrate. For example, a layer of copper can be blanket deposited to, the first side of the flex circuit substrate prior to formation of the traces and solder mask on the first side. Portions of the copper layer can be selectively removed to form the traces in a region for die attachment. Such selective removal can further form a cavity in the copper layer to allow a die to be attached to the flex circuit substrate. The remaining copper layer that is not formed into traces on the first side can function as a stiffening structure to provide structural integrity for other packaging operations. Suitable materials other than copper can be used in other embodiments.

In another embodiment, the stiffening structure is formed by pre-fabricating the stiffening structure and attaching the stiffening structure to the first side of the flex circuit substrate. The stiffening structure can be attached using any suitable technique including, for example, using adhesives such as solder paste or silver paste.

The stiffening structure increases structural stability and integrity to allow attachment of the IC die to the flex circuit substrate. In an embodiment, the stiffening structure is formed prior to selectively removing portions of the blanket metal layer on the second side.

At block 606, portions of the blanket metal layer are selectively removed to form traces on the second side of the flex circuit substrate. Selectively removing the portions of the blanket metal layer can be performed, for example, using photoresist or hard mask patterning operations already described in connection with FIG. 5. The stiffening structure provides structural support to the flex circuit substrate during selective removal of portions of the blanket metal layer and other operations such as die attach, wire bonding, and molding.

At block 608, the IC die is attached to the first side of the flex circuit substrate. The die is attached to the first side using techniques described herein or any other suitable technique.

At block 610, additional packaging operations are performed to prepare the flex circuit for use as a product. For example, a molding process can be used to deposit a mold compound to encapsulate the IC die. In some embodiments, a solder mask material is deposited to cover the traces on the second side. Portions of the solder mask material are selectively removed to form a solder mask on the second side that allows electrical connection to the traces on the second side. In some embodiments, solder balls are attached to the second side of the flex circuit substrate. Plating operations to prepare areas on the first side and/or second side of the flex circuit substrate for electrical connections can be performed. Singulation can be performed to provide discrete flex circuit products. In some embodiments, the stiffening structure may be removed as part of singulation to provide the discrete flex circuit products. A passive component can be attached to the flex circuit substrate as described in connection with to FIGS. 1 and 5. Other additional operations can be performed.

Figure 7:
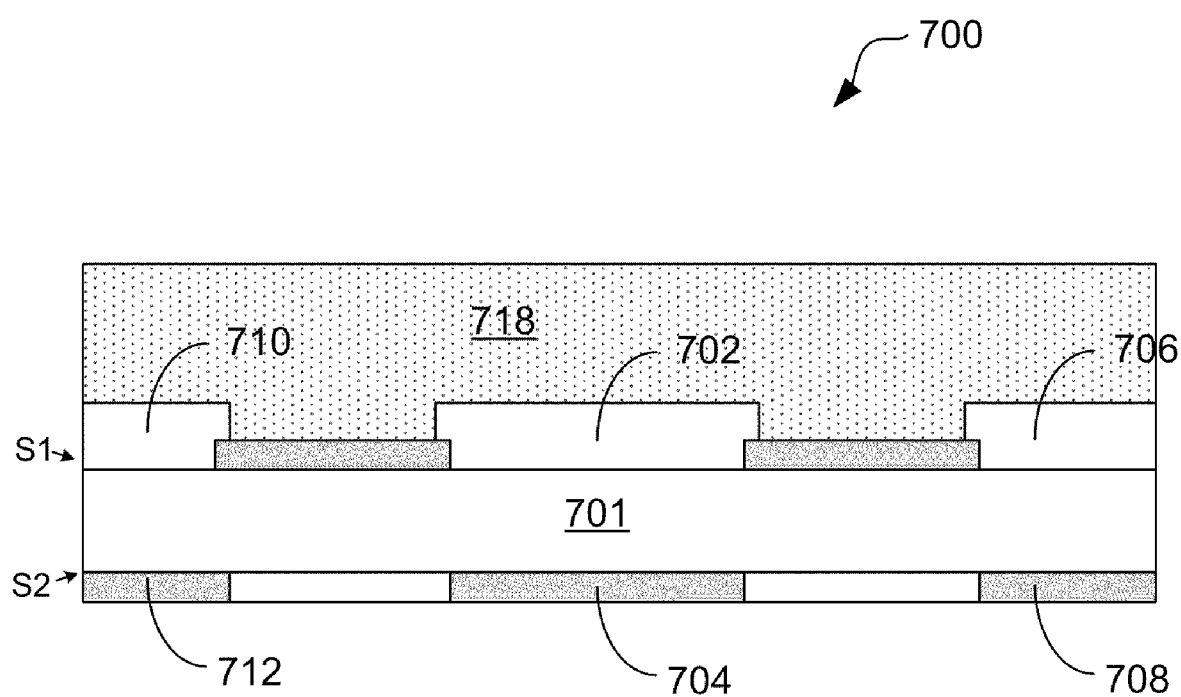
FIG. 7 schematically illustrates a plan view of a flex circuit package, in accordance with various embodiments.

It should be further noted that when forming traces or metal portions on the second side of the flex circuit substrate, the traces or metal portions are placed in such a way as to complement or mirror the non-metal areas formed on the first side of the flex circuit substrate. This complementary configuration provides additional structural support for the flex circuit substrate. FIG. 7 schematically illustrates a plan view of a flex circuit package 700 having a complementary configuration in accordance with one embodiment. As shown in FIG. 7, the flex circuit package 700 includes a non-metal area such as a solder mask 702 located on the first side S1 of core 701. On the second side S2, a corresponding metal portion 704 such as a trace is formed to complement or mirror the solder mask 702. Similarly, metal portions 708, 712 are formed to complement or mirror solder masks 706, 710 respectively. By complementing or mirroring the non-metal areas with metal portions on the second side S2, additional structural support is provided for the flex circuit package 700. A mold compound 718 may be formed on the first side S1 as shown.

It should be noted that the metal portions that are formed to complement or mirror the non-metal areas may substantially match the size and/or shape of the non-metal areas. In some embodiments, however, the size and/or shape of the metal portions may vary depending on various factors, such as, space availability and design constraints.

Figure 8A:
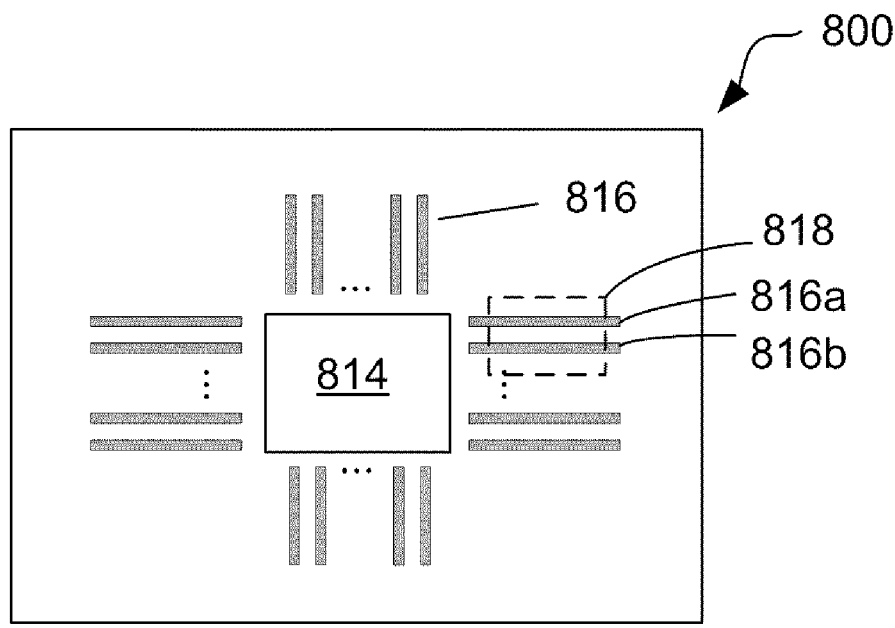
FIG. 8A schematically illustrates a plan view of a flex circuit package, in accordance with various embodiments.
Figure 8B:
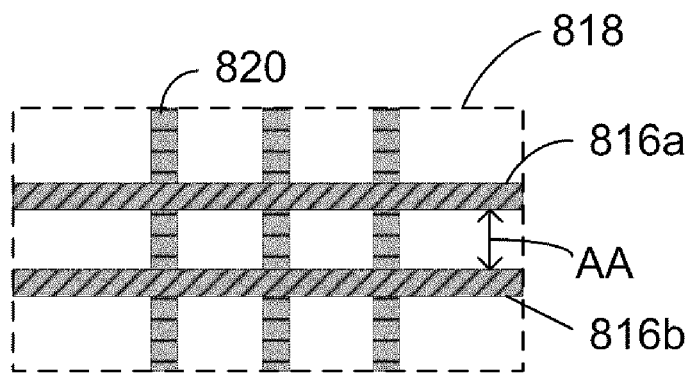
FIG. 8B schematically illustrates a plan view of a close-up section of the flex circuit package as shown in FIG. 8A, in accordance with various embodiments.
Figure 8C:
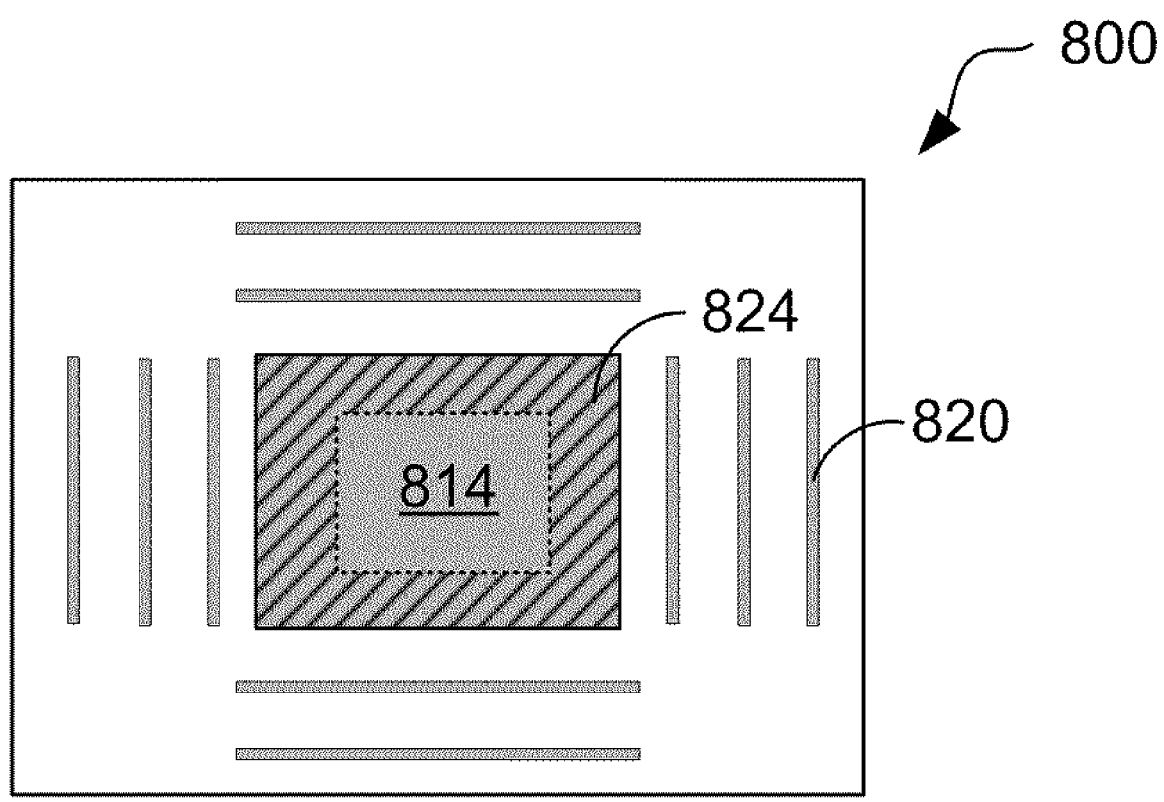
FIG. 8C schematically illustrates a bottom plan view of the flex circuit package as shown in FIG. 8A, in accordance with various embodiments.

FIG. 8A schematically illustrates a plan view of a flex circuit package 800 in accordance with one embodiment. The flex circuit package 800 includes a die 814 and a plurality of metal traces 816 surrounding the die 814. FIG. 8B schematically illustrates a close-up section 818 of the flex circuit package 800. The close-up section 818 shows a transparent view of a plurality of metal portions 820 located on the bottom surface of the flex circuit package 800. The plurality of metal portions 820 are provided to improve structural integrity. The metal traces 816*a* and 816*b* are disposed in a generally parallel configuration in a horizontal direction and have a non-metal area between them. Without the metal portions 820, the non-metal area would be susceptible to stretching or other movement generally along the direction AA. By providing the metal portions 820 on the bottom surface of the flex circuit package 800, the metal portions 820 provide additional structural reinforcement to limit or minimize movement of the non-metal area between the metal traces 816*a* and 816*b*. In a configuration as shown in FIG. 8B, the metal portions 820 are generally orthogonal to the metal traces 816*a* and 816*b*. However, it should be understood that the metal portions 820 can also be placed in other directions or orientations with respect to the metal traces 816*a* and 816*b*. In another configuration, the metal portions 820 can be replaced by a single integrated metal portion that roughly complements or mirrors the non-metal area between the metal traces 816*a* and 816*b*. Based on the disclosure and teachings provided herein, it should be further understood that the structure shown in FIG. 8B can be expanded and used in other portions of the flex circuit package 800. FIG. 8C illustrates a bottom plan view of the flex circuit package 800 as shown in FIG. 8A. The structure shown in FIG. 8C complements or mirrors the structure shown in FIG. 8A. A metal portion 824 is used on the bottom of the flex circuit package 800 to provide additional structural support for the die 814 and its surrounding areas. Furthermore, the metal portions 820 are used on the bottom of the flex circuit package 800 to provide additional structural support for the corresponding metal traces 816.

Although certain embodiments have been illustrated and described herein, a wide variety of alternate and/or equivalent embodiments or implementations calculated to achieve the same purposes may be substituted for the embodiments illustrated and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. A method comprising:
   providing a flex circuit substrate comprising
   a core comprising an electrically insulative material,
   a first solder mask and first traces disposed on the core on a first side of the flex circuit substrate,
   a blanket metal layer disposed on the core on a second side of the flex circuit substrate to increase structural rigidity of the flex circuit substrate, wherein the second side is opposite to the first side, and
   vias formed through the core to electrically couple the first traces and the blanket metal layer;
   attaching an integrated circuit die to the first side of the flex circuit substrate;
   depositing a mold compound to substantially cover the integrated circuit die and the first side of the flex circuit substrate;
   selectively removing portions of the blanket metal layer to form second traces on the second side of the flex circuit substrate: and
   providing a stiffening structure on the first side of the flex circuit substrate,
   wherein the stiffening structure provides structure support to allow attachment of the integrated circuit die to the flex circuit substrate.

2. The method of claim 1, further comprising:
   depositing a photoresist material on the blanket metal layer; and
   exposing the photoresist material to light energy in order to define a pattern for the second traces, wherein selectively removing the portions of the blanket metal layer comprises etching the pattern to form the second traces.

3. The method of claim 2, wherein:
   depositing the photoresist material on the blanket metal layer occurs prior to attaching the integrated circuit die to the first side; and
   etching the pattern to form the second traces occurs after attaching the integrated circuit die to the first side.

4. The method of claim 1, further comprising:
   depositing a hardmask material on the blanket metal layer, the hardmask material defining a pattern for the second traces, wherein selectively removing the portions of the blanket metal layer comprises etching the pattern to form the second traces.

5. The method of claim 4, wherein:
   depositing the hardmask material on the blanket metal layer occurs prior to attaching the integrated circuit die to the first side; and
   etching the pattern to form the second traces occurs after attaching the integrated circuit die to the first side.

6. The method of claim 2, wherein attaching the integrated circuit die to the first side of the flex circuit substrate comprises electrically coupling the integrated circuit die to the first traces in at least one of a wire bonding, flip-chip, and multi-chip module arrangement.

7. The method of claim 1, further comprising:
   depositing a solder mask material to cover the second traces; and
   selectively removing portions of the solder mask material to form a second solder mask that allows electrical connection to at least one of the second traces.

8. The method of claim 7, further comprising:
   attaching solder balls to the second side of the flex circuit substrate to form an electrical connection between the solder balls and the second traces.

9. The method of claim 1, further comprising:
   attaching a passive component to the first side of the flex circuit substrate prior to attaching the integrated circuit die to the first side of the flex circuit substrate.

10. The method of claim 1, wherein providing the stiffening structure on the first side of the flex circuit substrate comprises;
    forming the stiffening structure on the first side to increase structural rigidity of the flex circuit substrate.

11. The method of claim 10, wherein forming the stiffening structure on the first side comprises:

depositing a metal layer to the first side of the flex circuit substrate; and selectively removing portions of the metal layer to provide an area for attachment of the integrated circuit die to the flex circuit substrate.

12. The method of claim 11, wherein depositing a metal layer to the first side of the flex circuit substrate provides a material used to form the first traces.

13. The method of claim 10, wherein forming the stiffening structure on the first side comprises;

attaching the stiffening structure to the first side of the flex circuit substrate.

14. The method of claim 10, wherein forming the stiffening structure on the first side is performed prior to selectively removing portions of the blanket metal layer.

15. An apparatus comprising: a flex circuit substrate having a core, the core comprising an electrically insulative material;

a first solder mask and first traces disposed on the core on a first side of the flex circuit substrate;

a second solder mask and second traces disposed on the core on a second side of the flex circuit substrate, the first side being opposite to the second side;

vias formed through the core to electrically couple the first traces to the second traces;

a stiffening structure coupled to the first side of the flex circuit substrate to increase structural rigidity of the flex circuit substrate to allow attachment of an integrated circuit die to the first side of the flex circuit substrate; and a blanket metal layer disposed on the core on the second side of the flex circuit substrate to increase structural rigidity of the flex circuit substrate, wherein portions of the blanket rental layer are selectively removed to from the second traces.

16. The apparatus of claim 15, wherein the stiffening structure is physically located substantially around a perimeter of the first side of the flex circuit substrate.

17. The apparatus of claim 15, wherein the stiffening structure comprises a material having at least one of copper, iron, and a flame retardant 4 (FR-4) material.

18. The apparatus of claim 15, further comprising:

the integrated circuit die attached to the first side of the flex circuit substrate and electrically coupled to the first traces.

19. The apparatus of claim 16, further comprising:

a mold compound coupled to encapsulate the integrated circuit die.

20. The apparatus of claim 16, further comprising:

solder balls attached to the second side and electrically coupled to the second traces.

* * * * *